US010037936B2

(12) United States Patent
Tsai et al.

(10) Patent No.: US 10,037,936 B2
(45) Date of Patent: Jul. 31, 2018

(54) SEMICONDUCTOR PACKAGE WITH COATED BONDING WIRES AND FABRICATION METHOD THEREOF

(71) Applicant: MEDIATEK INC., Hsin-Chu (TW)

(72) Inventors: Shiann-Tsong Tsai, Hsinchu (TW); Hsueh-Te Wang, Hsinchu (TW); Chin-Chiang Chang, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/176,163

(22) Filed: Jun. 8, 2016

(65) Prior Publication Data

US 2017/0125327 A1 May 4, 2017

Related U.S. Application Data

(60) Provisional application No. 62/249,671, filed on Nov. 2, 2015, provisional application No. 62/251,775, filed on Nov. 6, 2015.

(51) Int. Cl.
*H01L 23/495* (2006.01)
*H01L 21/48* (2006.01)
(Continued)

(52) U.S. Cl.
CPC .... *H01L 23/49586* (2013.01); *H01L 21/4825* (2013.01); *H01L 21/4853* (2013.01); *H01L 21/565* (2013.01); *H01L 23/3157* (2013.01); *H01L 23/4952* (2013.01); *H01L 23/49811* (2013.01); *H01L 23/49838* (2013.01); *H01L 23/49894* (2013.01); *H01L 24/48* (2013.01);
(Continued)

(58) Field of Classification Search
CPC .............. H01L 23/49586; H01L 21/4853
See application file for complete search history.

(56) References Cited

U.S. PATENT DOCUMENTS 6,531,760 B1 * 3/2003 Murakami .......... H01L 23/3107
257/665
7,202,109 B1 * 4/2007 Zakharian ............ H01L 21/568
257/E23.033
(Continued)

FOREIGN PATENT DOCUMENTS

DE 10 2005 025 465 A1 12/2006
JP 200031195 A 1/2000
(Continued)

OTHER PUBLICATIONS

Peng Su et al., An Evaluation of Effects of Molding Compound Properties on Reliability of Cu Wire Components, 2011 Electronic Components and Technology Conference, 2011, pp. 363-369, XP031996564, IEEE.

*Primary Examiner* — Moazzam Hossain
*Assistant Examiner* — Farun Lu
(74) *Attorney, Agent, or Firm* — Wolf, Greenfield & Sacks, P.C.

(57) ABSTRACT

A semiconductor package includes a carrier substrate having a top surface, a semiconductor die mounted on the top surface, a plurality of bonding wires connecting the semiconductor die to the carrier substrate, an insulating material coated on the bonding wires, and a molding compound covering the top surface and encapsulating the semiconductor die, the plurality of bonding wires, and the insulating material.

9 Claims, 5 Drawing Sheets

(51) Int. Cl.
*H01L 21/56* (2006.01)
*H01L 23/31* (2006.01)
*H01L 23/498* (2006.01)
*H01L 23/00* (2006.01)
*H01L 23/29* (2006.01)

(52) U.S. Cl.
CPC ........ *H01L 23/295* (2013.01); *H01L 23/3121* (2013.01); *H01L 24/29* (2013.01); *H01L 24/32* (2013.01); *H01L 24/45* (2013.01); *H01L 24/49* (2013.01); *H01L 24/73* (2013.01); *H01L 24/85* (2013.01); *H01L 2224/04042* (2013.01); *H01L 2224/2919* (2013.01); *H01L 2224/32225* (2013.01); *H01L 2224/32245* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/49052* (2013.01); *H01L 2224/49171* (2013.01); *H01L 2224/49175* (2013.01); *H01L 2224/73265* (2013.01); *H01L 2224/8592* (2013.01); *H01L 2924/00014* (2013.01); *H01L 2924/181* (2013.01); *H01L 2924/3862* (2013.01)

(56) References Cited

U.S. PATENT DOCUMENTS

| | | |
|---|---|---|
| 2007/0090539 A1 | 4/2007 | Hosseini |
| 2010/0164083 A1 | 7/2010 | Yim |
| 2013/0175709 A1* | 7/2013 | Low ................ H01L 24/85 257/784 |
| 2015/0303151 A1 | 10/2015 | Kobayashi |
| 2017/0053893 A1 | 2/2017 | Fukue |

FOREIGN PATENT DOCUMENTS

| | | |
|---|---|---|
| JP | 2006351737 A | 12/2006 |
| JP | 2013197531 A | 9/2013 |
| TW | 200712089 | 4/2007 |
| TW | 201443975 A | 11/2014 |
| TW | 201528450 A | 7/2015 |
| WO | 2009079122 A1 | 6/2009 |

* cited by examiner

SEMICONDUCTOR PACKAGE WITH COATED BONDING WIRES AND FABRICATION METHOD THEREOF

CROSS REFERENCE TO RELATED APPLICATIONS

This application claims the priority from U.S. provisional application No. 62/249,671 filed Nov. 2, 2015 and the priority from U.S. provisional application No. 62/251,775 filed Nov. 6, 2015.

BACKGROUND

The present disclosure relates generally to the field of semiconductor packaging. More particularly, the present disclosure relates to a semiconductor integrated circuit (IC) package with coated bonding wires and a method for making the same.

In the integrated circuit (IC) packaging industry, there is a continuous desire to provide higher and higher density IC packages for semiconductor die having increasing numbers of input/output (I/O) terminal pads. When using a conventional wire bonding packaging technique, the pitch, or spacing between adjacent bonding wires becomes finer and finer as the number of I/O terminal pads increases for a given size die.

During the molding or encapsulation of a plastic IC package, the flow of a plastic molding compound melt into a mold cavity exerts forces sufficiently high as to displace or deform the bonding wires, hence resulting in bonding wire sweep or mold wire sweep. The wire deformation causes adjacent bond wires to come into contact with each other, which results in shorting between adjacent wires.

Although a variety of approaches have been suggested for reducing the bonding wire sweep during the encapsulating process of an IC package, many of these approaches require additional process steps or require specialized equipment. These requirements for additional process steps or specialized equipment add to the costs of producing the package and are therefore undesirable.

SUMMARY

It is an object of the invention to provide an improved semiconductor device and package having insulator-coated bonding wires in order to solve the above-mentioned prior art problems and shortcomings.

According to one aspect of the invention, a semiconductor package includes a carrier substrate having a top surface, a semiconductor die mounted on the top surface, a plurality of bonding wires connecting the semiconductor die to the carrier substrate, an insulating material coated on the bonding wires, and a molding compound covering the top surface and encapsulating the semiconductor die, the plurality of bonding wires, and the insulating material.

According to one embodiment, the insulating material only covers at least a partial portion of each of the bonding wires. According to one embodiment, the top surface of the carrier substrate is also coated with the insulating material.

According to one embodiment, the molding compound comprises an epoxy resin and a filler material, and the insulating material comprises the epoxy resin but without the filler material. According to another embodiment, the insulating material comprises the epoxy resin with a lower content of the filler material.

According to another aspect of the invention, a method for forming a semiconductor package is disclosed. A carrier substrate having a top surface is provided. A semiconductor die is mounted on the top surface. A plurality of bonding wires is formed to connect the semiconductor die to the carrier substrate. An insulating material is then coated on the bonding wires. A molding compound is then formed to encapsulating the semiconductor die, the plurality of bonding wires, and the insulating material.

According to one embodiment, after coating the insulating material on the bonding wires, a curing process is performed to cure the insulating material. According to one embodiment, the curing process is carried out in an oven or under actinic radiation conditions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 1:
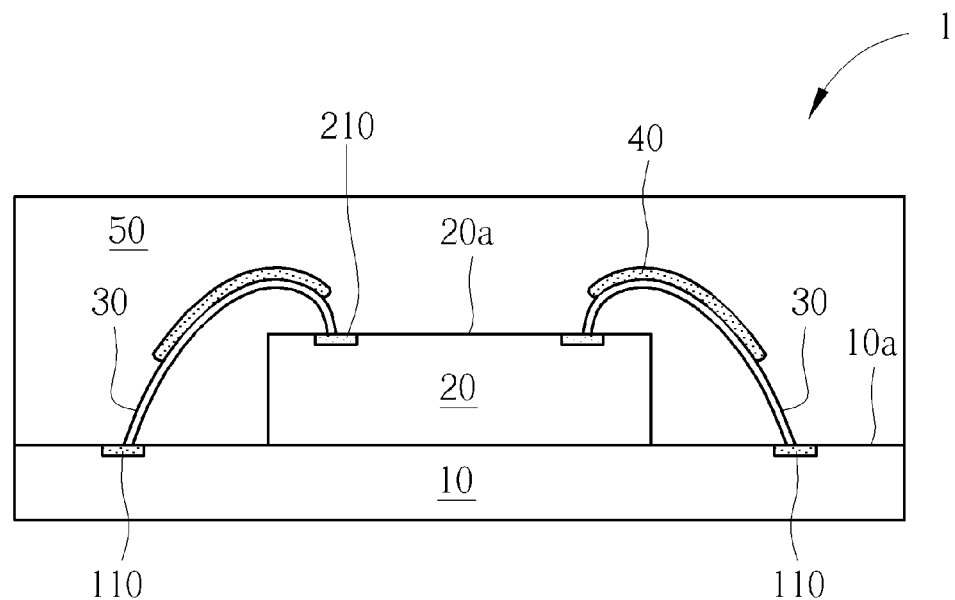
FIG. 1 is a schematic, cross-sectional diagram showing an exemplary semiconductor package with coated bonding wires according to one embodiment of the invention.
Figure 2:
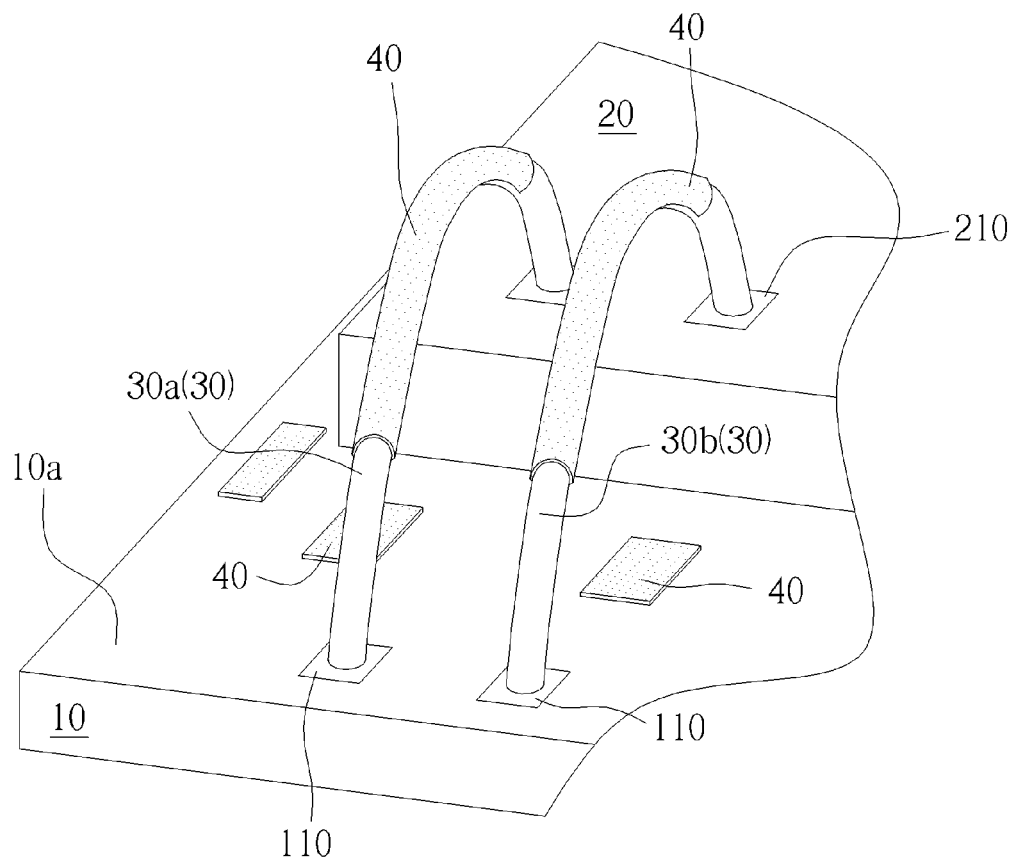
FIG. 2 is a schematic, perspective view of two adjacent bonding wires in FIG. 1 without the molding compound for clarity.

Please refer to FIG. 1 and FIG. 2. FIG. 1 is a schematic, cross-sectional diagram showing an exemplary semiconductor package with coated bonding wires according to one embodiment of the invention. FIG. 2 is a schematic, perspective view of two adjacent bonding wires in FIG. 1 without the molding compound for clarity.

As shown in FIG. 1 and FIG. 2, the semiconductor package 1 comprises a carrier substrate 10 having a top surface 10a. A semiconductor die 20 is mounted on the top surface 10a. The semiconductor die 20 has an active surface 20a, on which a plurality of input/output (I/O) pads 210 is distributed. According to the illustrative embodiment, the semiconductor die 20 is electrically connected to the bond fingers 110 on the top surface 10a of the carrier substrate 10 through a plurality of bonding wires 30. According to the illustrative embodiment, the bonding wires 30 may comprise copper, gold, silver, or any suitable conductive materials. According to the illustrative embodiment, the carrier substrate 10 may comprise a packaging substrate, an interposer substrate, or a leadframe substrate, but is not limited thereto.

According to the illustrative embodiment, the bonding wires 30 are partially coated with an insulating material 40. According to the illustrative embodiment, the insulating material 40 may comprise polymers, epoxy, or resins, but is not limited thereto. The insulating material 40 coated on the bonding wires 30 may be cured to provide the bonding wires 30 with extra mechanical support. The insulating material 40 secures the bonding wires 30 and is able to resist the mold wire sweep during the encapsulation process of the semiconductor package 1. According to the illustrative embodiment, the insulating material 40 has low permittivity or low dielectric constant (low-k) that can prevent shorting and alleviate crosstalk between adjacent wires. In other embodiments, the bonding wires 30 may be fully coated with the insulating material 40 to provide a more desirable isolation effect.

According to the illustrative embodiment, the semiconductor package 1 further comprises a molding compound 50 on the top surface 10a of the carrier substrate 10. The molding compound 50 encapsulates the bonding wires 30, the insulating material 40, and the semiconductor die 20. According to the illustrative embodiment, the molding compound 50 may comprise an epoxy resin and a filler material, but is not limited thereto. According to the illustrative embodiment, the insulating material 40 may have the same epoxy composition as that of the molding compound 50, but without the filler material or with lower content of the filler material. According to the illustrative embodiment, the insulating material 40 contains less than 50 ppm halogen content in order to prevent corrosion of the bonding wires 30. According to another embodiment, the insulating material 40 may have a composition that is different from that of the molding compound 50.

As shown in FIG. 2, only two adjacent bonding wires 30a and 30b are illustrated for the sake of simplicity. The insulating material 40 is partially coated on the portions of the two adjacent bonding wires 30a and 30b that are most likely to short to the adjacent wires during the wire sweep that occurs during the encapsulation process of the semiconductor package 1. According to the illustrative embodiment, the insulating material 40 may be also formed on the top surface 10a of the carrier substrate 10 or elsewhere in the semiconductor package 1. The insulating material 40 formed on the top surface 10a of the carrier substrate 10 may enhance the interface adhesive strength between the molding compound 50 and the carrier substrate 10.

The two adjacent bonding wires 30a and 30b may have different loop heights. It is advantageous to use the present invention because the insulating material 40 coated on the bonding wires 30a and 30b can avoid abnormal wire sweep during encapsulation process and provide significant isolation effect. Furthermore, the loop heights of the two adjacent bonding wires 30a and 30b may be reduced such that more wires can be arranged in the same space.

Figure 3:
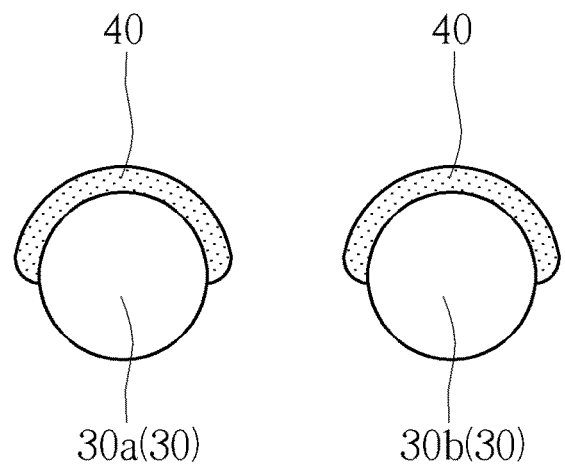
FIG. 3 is a schematic, cross-sectional diagram showing the two adjacent bonding wires and the coated insulating material.

FIG. 3 is a schematic, cross-sectional diagram showing the two adjacent bonding wires and the coated insulating material. As shown in FIG. 3, according to the illustrative embodiment, the insulating material 40 may only cover at least a partial portion, for example upper half portion, of each of the bonding wires 30 when viewed in cross-sections of the bonding wires 30. According to the illustrative embodiment, the lower half portion of each of the bonding wires 30 is not covered by the insulating material 40. However, it is understood that, in some embodiments, each of the bonding wires 30 may be wrapped around by the insulating material 40.

Figure 4:
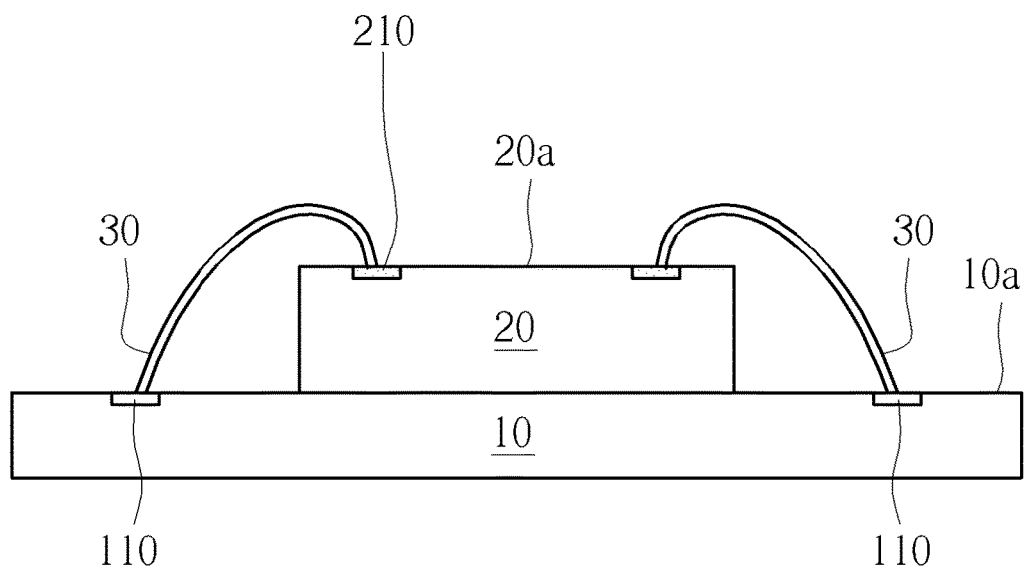
FIG. 4 to FIG. 7 are schematic, cross-sectional diagrams showing an exemplary method for forming the semiconductor package with coated bonding wires according to one embodiment of the invention.
Figure 5:
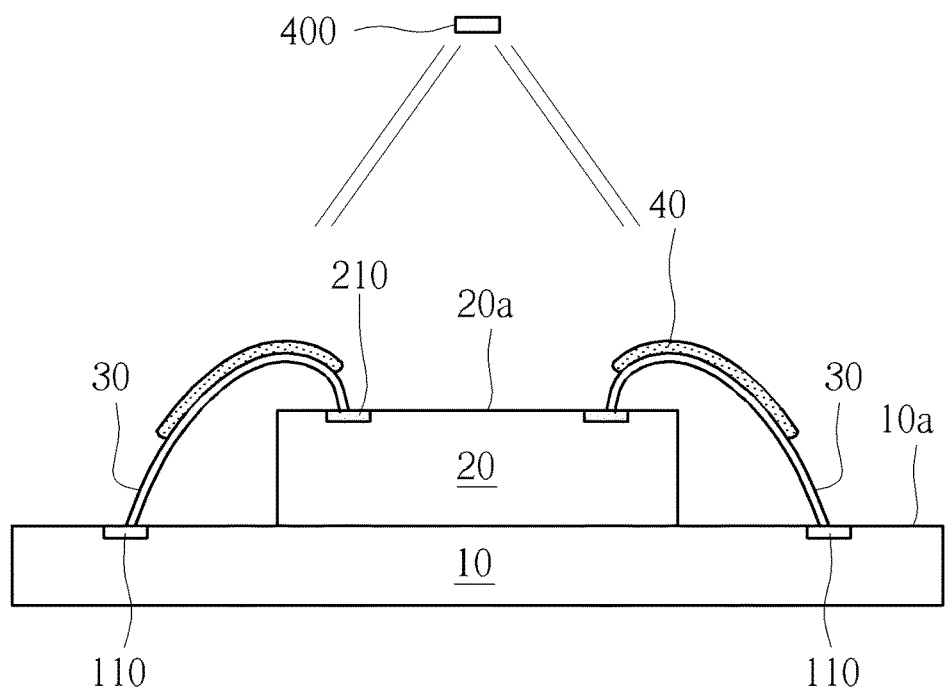

FIG. 4 to FIG. 7 are schematic, cross-sectional diagrams showing an exemplary method for forming the semiconductor package with coated bonding wires according to one embodiment of the invention, wherein like numeral numbers designate like layers, regions, or elements. As shown in FIG. 4, a semiconductor die 20 is mounted on a top surface 10a of a carrier substrate 10. According to the illustrative embodiment, the carrier substrate 10 may comprise a packaging substrate, an interposer substrate, or a leadframe substrate, but is not limited thereto. The semiconductor die 20 may be adhered to the top surface 10a by using an adhesive (not explicitly shown), but is not limited thereto. According to the illustrative embodiment, the semiconductor die 20 is electrically connected to the bond fingers 110 on the top surface 10a of the carrier substrate 10 through a plurality of bonding wires 30.

Figure 8:
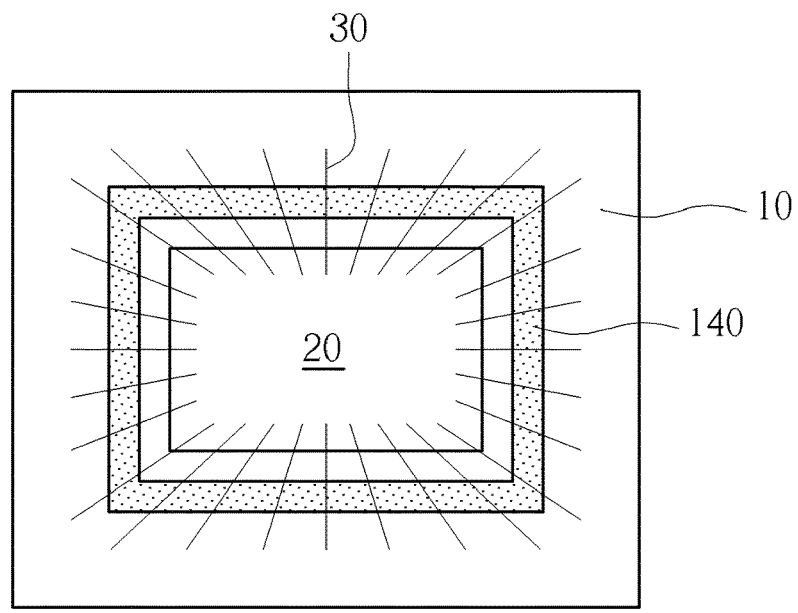
FIG. 8 is a schematic top view of the semiconductor package showing an exemplary region around the semiconductor die, in which the insulating material is sprayed.

After the wire-bonding process, an insulating material 40 is sprayed onto the bonding wires 30 within predetermined regions. For example, referring to FIG. 8, a region 140 is demonstrated around the semiconductor die 20. The insulating material 40 may be sprayed onto the bonding wires 30 within the region 140 that would be most likely to short to the adjacent wires during the encapsulation process. According to the illustrative embodiment, the insulating material 40 may be sprayed onto the top surface 10a of the carrier substrate 10 or onto the active surface 20a of the semiconductor die 20, which may enhance the interface adhesive strength between the molding compound and the substrate surface/die surface. It is understood the region 140 shown in FIG. 8 is for illustration purposes only.

Figure 9:
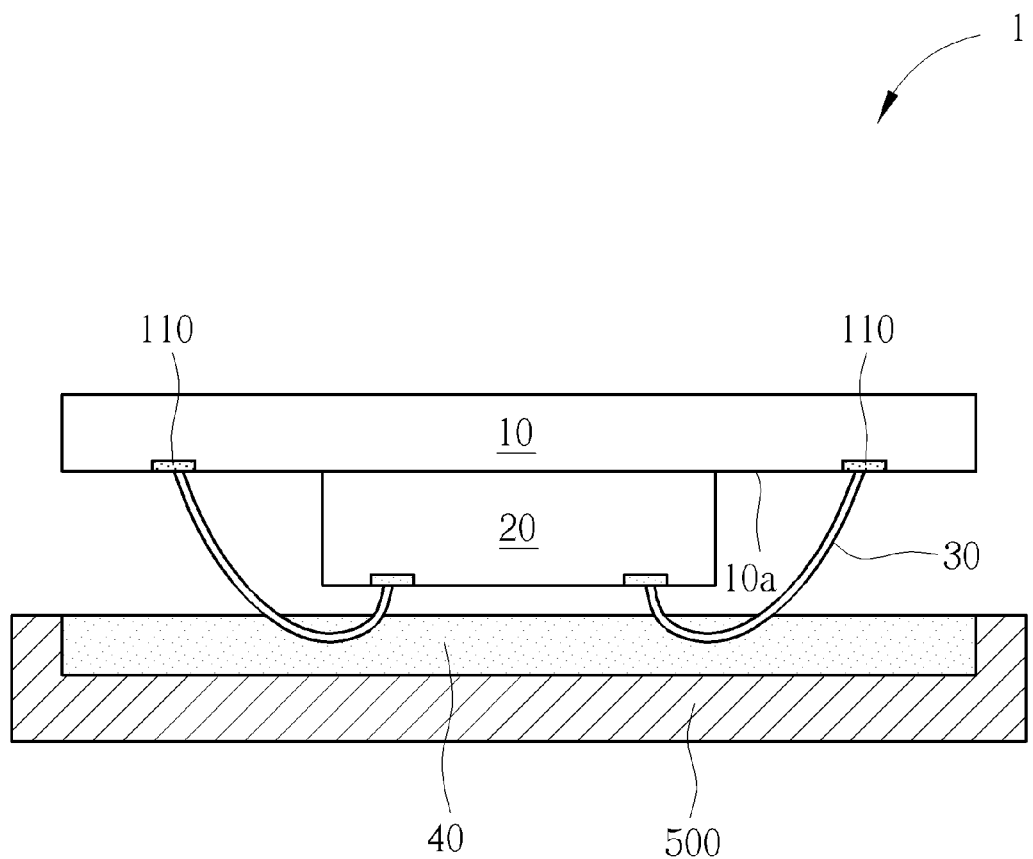
FIG. 9 is a schematic, cross-sectional diagram showing a dipping process for coating an insulating material onto the bonding wires according to another embodiment of the invention.

According to the illustrative embodiment, the insulating material 40 may be sprayed onto the bonding wires 30 by using a jet sprayer 400 or the like. However, in some embodiments, the insulating material 40 may be coated onto the bonding wires 30 by using a dipping process. For example, referring to FIG. 9, a container 500 contains the insulating material 40 in liquid phase. The package 1 is flipped and the bonding wires 30 may be partially dipped into the insulating material 40 to coat the bonding wires 30. Subsequently, a drying process or baking process may be performed to remove the solvent.

Figure 6:
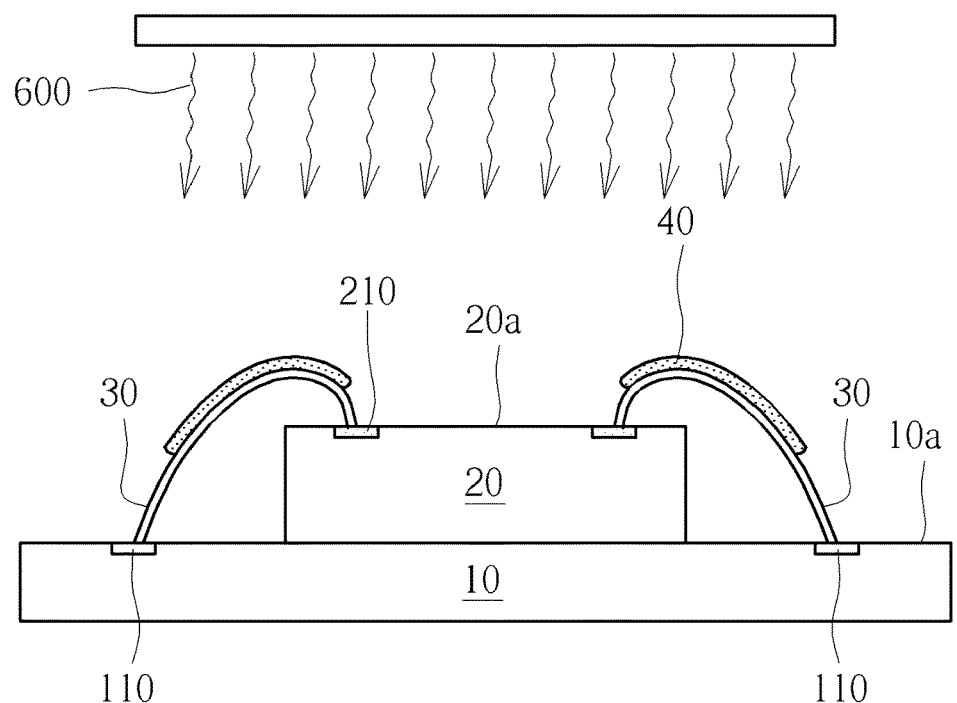

As shown in FIG. 6, after spraying the insulating material 40, an optional curing process 600 may be carried out to cure the insulating material 40. According to the illustrative embodiment, the curing process 600 may be carried out in an oven or under actinic radiation conditions, but is not limited thereto. For example, the curing process 600 may be a fast curing process under ultraviolet (UV) or infrared (IR) irradiation. It is understood that the curing process 600 may be skipped in some embodiments, and the insulating material 40 may be cured at a later stage, together with the molding compound.

Figure 7:
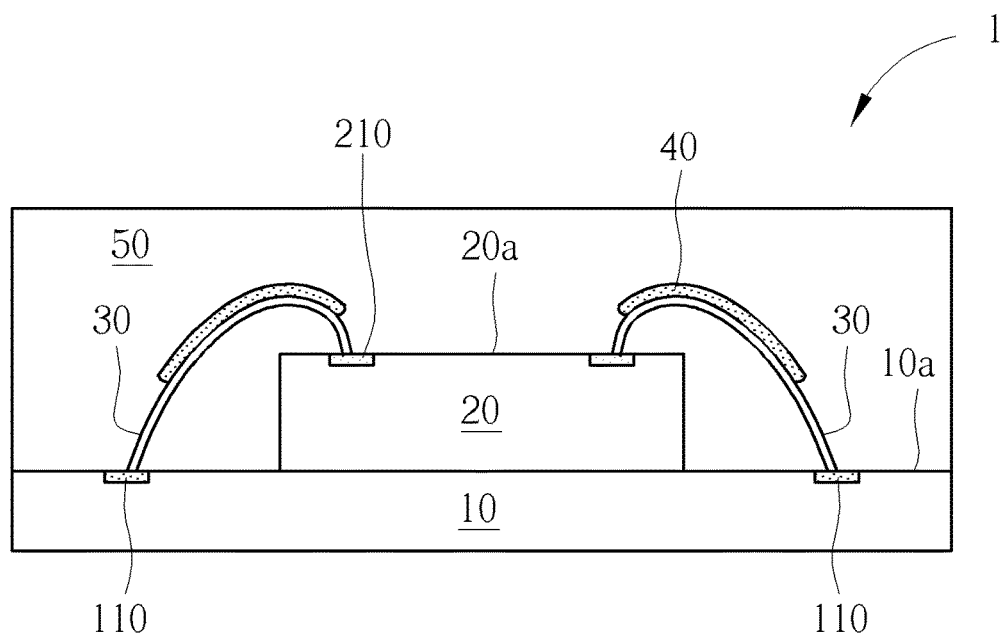

As shown in FIG. 7, a molding compound 50 is formed on the top surface 10a of the carrier substrate 10 to encapsulate the bonding wires 30, the insulating material 40, and the semiconductor die 20. According to the illustrative embodiment, the molding compound 50 may comprise an epoxy resin and a filler material, but is not limited thereto. According to the illustrative embodiment, the insulating material 40 may have the same epoxy composition as that of the molding compound 50, but without the filler material or with lower content of the filler material. According to the illustrative embodiment, the insulating material 40 contains less than 50 ppm halogen content in order to prevent corrosion of the bonding wires 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a carrier substrate having a top surface;
   a semiconductor die mounted on the top surface;
   a plurality of bonding wires connecting the semiconductor die to the carrier substrate;
   an insulating material coated on the bonding wires wherein the insulating material is disposed only on an upper half-circumference of each of the plurality of bonding wires; and
   a molding compound covering the top surface and encapsulating the semiconductor die, the plurality of bonding wires, and the insulating material,
   wherein the insulating material has a different composition from that of the molding compound.

2. The semiconductor package according to claim 1, wherein the top surface of the carrier substrate is also coated with the insulating material.

3. The semiconductor package according to claim 1, wherein the molding compound comprises an epoxy resin and a filler material.

4. The semiconductor package according to claim 3, wherein the insulating material comprises the epoxy resin but without the filler material.

5. The semiconductor package according to claim 3, wherein the insulating material comprises the epoxy resin with a lower content of the filler material.

6. The semiconductor package according to claim 1, wherein the insulating material contains less than 50 ppm halogen content.

7. The semiconductor package according to claim 1, wherein the carrier substrate comprises a packaging substrate, an interposer substrate, or a leadframe substrate.

8. The semiconductor package according to claim 1, wherein the insulating material is curable by ultraviolet or infrared radiation.

9. The semiconductor package according to claim 1, wherein the molding compound contacts undersides of the plurality of bonding wires.

* * * * *